April 9, 1968 B. H. HEISE 3,377,577
METHOD FOR OPERATING A SUPERCONDUCTING DEVICE
Filed Aug. 27, 1964
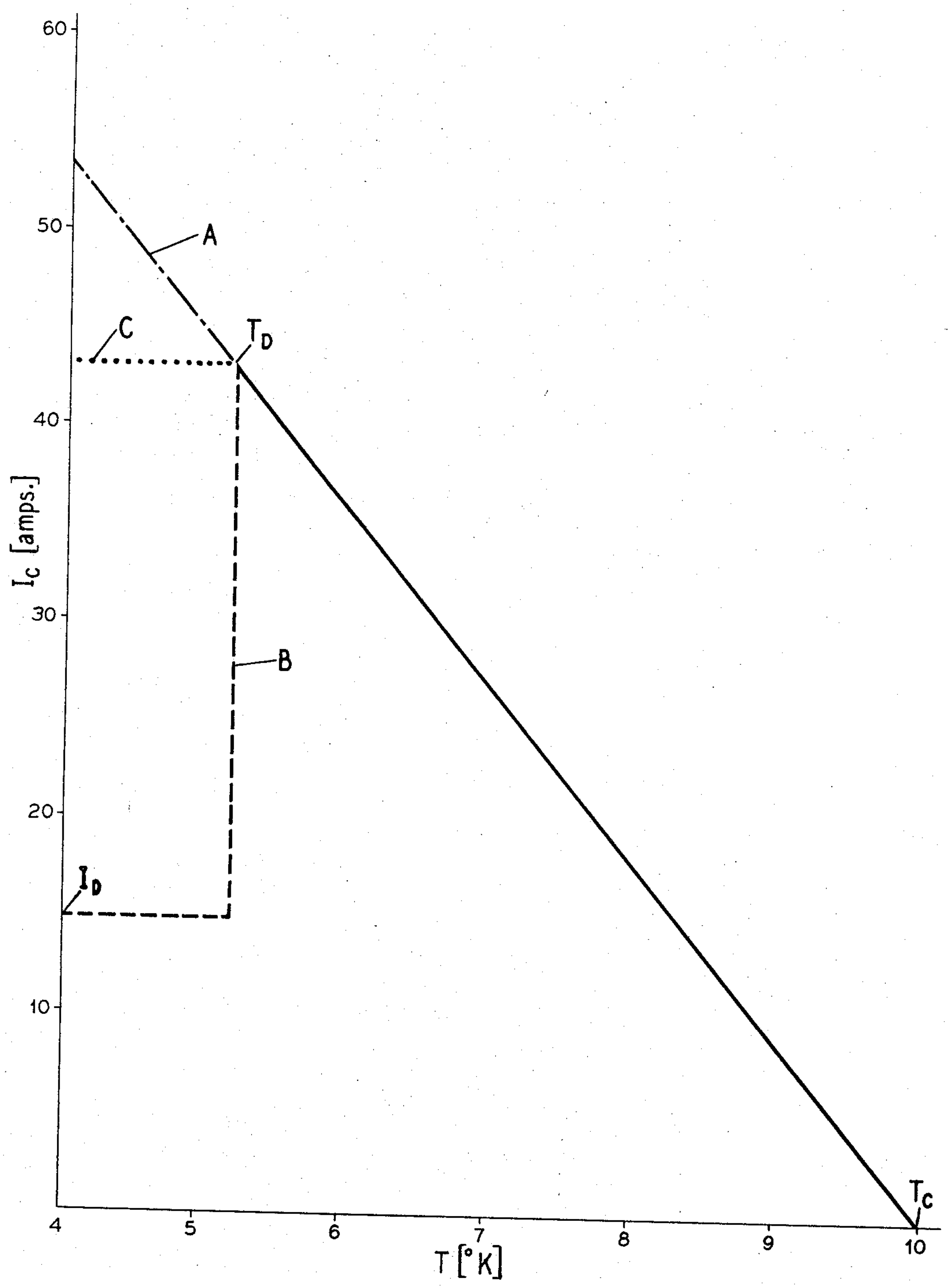
INVENTOR
BARRETT H. HEISE
BY Leo A. Plum, Jr.
ATTORNEY 3,377,577

METHOD FOR OPERATING A SUPERCONDUCTING DEVICE

Barrett H. Heise, Kenmore, N.Y., assignor to Union Carbide Corporation, a corporation of New York
Filed Aug. 27, 1964, Ser. No. 392,461
6 Claims. (Cl. 335—216)

ABSTRACT OF THE DISCLOSURE

A method for operating a superconducting magnet by activating the magnet at an intermediate temperature above the degradation temperature and below the transition temperature after the magnet has reached thermal equilibrium at the intermediate temperature.

This invention relates to a method for improving the performance of superconductive current-carrying devices exposed to either self-generated or externally generated magnetic fields. In particular, this invention relates to a method for improving the performance of superconducting magnets constructed of Type III superconductors.

Many high field-high current superconducting devices constructed of Type III superconductors (called "hard superconductors"), such as solenoid magnets having size and characteristics suitable for practical applications or cylinders designed for flux trapping or flux shielding, do not have superconducting current and magnetic field capacities as large as predicted by measurements on straight wires formed from the same superconducting material. The diminished current and field capacities of these devices is known as the "degradation effect."

It has been observed, for example, that Type III superconducting materials having the largest "straight wire" critical currents and critical fields often have the smallest critical currents and critical fields when constructed into practical superconducting solenoids and cylinders. Consequently, Type III superconducting materials having less than optimum straight wire characteristics have been employed to minimize the degradation effect.

It is an object of this invention to provide a method for improving the critical currents and critical fields of practical superconducting devices constructed of Type III superconductors such that the degradation effects are reduced. Another object is to provide a method for operating such superconducting devices at currents larger than heretofore possible. These and other objects and novel features of this invention will become apparent from the following description and the accompanying drawing which is an exemplary plot of the critical current of a hard superconducting material versus the temperature of the superconducting material for; A a straight wire superconductor in a magnetic field equal to I times the gauss per amp rating of a device for which curve B is shown; B a superconducting device exposed to a magnetic field; and C a superconducting device exposed to a magnetic field operated according to this invention.

The following is a glossary of terms used in the description of this invention and in the claims:

Transition temperature ($T_c$), the temperature of a material having superconducting properties at which that material becomes superconducting and above which that material has normal resistance characteristics and cannot become superconducting; sometimes called "critical temperature."

Critical current ($I_c$) and critical field ($H_c$), the maximum current and field values which can be tolerated by the superconductor in its superconducting state. Exceeding either maximum results in the breakdown of the material into its normal state and results in a finite resistance.

The two values are interrelated, the highest value of critical field corresponding with zero critical current.

Degradation effect, description of the observed phenomenon that the critical current and critical field of a superconductor fabricated into a device is lower than predicted from critical current and critical field measurements on a straight wire of the same material.

Degradation temperature ($T_D$), the temperature below $T_c$ at which the critical current is a maximum in a superconducting device exposed to a magnetic field of a given intensity.

Type III superconductor, any superconducting metal, alloy or compound which, when in a geometical form having a zero magnetizing coefficient, allows the penetration of magnetic flux into the body of the materiad without losing its superconductive property, such flux penetration being irreversible.

Illustrative "hard superconducting" materials are metals such as niobium; intermetallic compounds such as niobium-tin, vanadium-silicide, vanadium-gallium, and niobium-aluminum; solid solution alloys such as niobium-zirconium, niobium-titanium, and molybdenum-rheinum.

Referring to curve A of the figure, a straight wire "hard superconductor" will become superconducting at a transition temperature ($T_c$) and, when exposed to any given magnetic field, the superconductor's critical current limit will increase as the superconductor's temperature is reduced below $T_c$. If that same superconductor is fabricated into a superconducting device, such as a solenoid for example, the critical current limit of the device will also increase as the temperature of the device is reduced below $T_c$. It has been discovered, however, that for devices fabricated from certain Type III superconductors a point will be reached at some temperature where the critical current reaches a maximum and will then decrease as shown by curve B of the figure. The temperature at which this discontinuity occurs is the degradation temperature ($T_D$). The exact shape of curve B and the temperature $T_D$ are dependent on the superconducting material employed and on the configuration of the superconducting device; for example, the length and diameter of the superconducting wire employed, the density of turns and the like will effect $T_D$ for a solenoid.

The reason for the existence of the degradation temperature is believed to be as follows.

It has been observed that the process of activating a superconductive device formed of a "hard superconductor," for example, by passing a current through such a device to produce a magnetic field or by inducing a current therein by a changing external magnetic field under certain conditions gives rise to an occurrence known as a "flux jump," the effect of which is the dissipation of energy in the form of heat. With the occurrence of a flux jump, that portion of the superconducting material experiencing the flux jump momentarily becomes resistive. Under conditions of good heat transfer and dissipation, such as exist in a straight wire immersed in liquid helium, flux jumps can be tolerated without the material returning to the normal state. However, under poorer conditions of heat transfer and dissipation, as exist in superconductive devices such as solenoids, the rapid release of energy resulting from a flux jump is compounded by the $I^2R$ loss due to the resistive portion of the superconductive material. Consequently, the rapid release of energy propagates throughout the superconductive device and irreversibly causes all of the superconductive material to become resistive.

Referring again to the figure, it has been discovered that the temperature of the device at the point where a flux jump will cause the entire superconductive device to become resistive when the device carries a critical current is the degradation temperature, $T_D$. Thus, at temperatures above $T_D$, the critical current limit indicated by curve A may be carried by the device and the occurrence of a flux jump during activation will not deleteriously affect the capacity of the device. At temperatures below $T_D$, the occurrence of a flux jump during activation when the device carries a current larger than the critical current indicated by curve B will result in the entire device becoming resistive rather than remaining superconducting.

Furthermore, as shown by curve B, it has been discovered that the above-described deleterious effects of a flux jump markedly increase at lower temperature, i.e., flux jumps at lower temperatures become more severe. This effect is not fully understood but it is thought that since current capacity increases at lower temperatures and greater magnetization is possible, a greater amount of energy is released in the flux jump at lower temperatures. Since the severity of flux jumps decreases at higher temperatures, superconductive devices such as solenoids can carry larger critical currents at higher temperatures; the upper limit being the critical current corresponding to the degradation temperature $T_D$. This is completely unexpected in view of the well known fact that the critical current capacity of straight wire superconductors improves as the temperature decreases.

In accordance with the present invention, therefore, a critical current corresponding to the current obtainable at $T_D$ can be charged in a solenoid or other similar superconductive device by bringing the device to thermal equilibrium at $T_D$, and activating the device with the critical current corresponding to $T_D$. After the transient state of activation has ceased, i.e., after the magnetic field corresponding to the current charged in the device has reached a steady state, the device may be cooled to any temperature below $T_D$, and nevertheless maintain that critical current as shown by curve C of FIGURE 1 inasmuch as no flux jump can then occur because of the steady state conditions. It has also been discovered that an additional current greater than the critical current corresponding to $T_D$ may be charged in the device after the device has been cooled to the desired temperature below $T_D$ without the device experiencing a flux jump.

If the current in a solenoid at a temperature slightly above $T_D$ is raised to a value slightly below its critical current at this temperature, cooling the solenoid to any temperature less than $T_D$ is always possible without the solenoid becoming normal. By means of this process, a solenoid which shows degradation can attain higher fields at temperatures below $T_D$ by energizing the solenoid at a temperature slightly above $T_D$ and then cooling it to any desired operating temperature. In this manner magnetic fields of a factor of about 2.5 greater than those reached by operating isothermally at a temperature less than $T_D$ have been realized. Further, it has been demonstrated that once the coil is cooled to a temperature below $T_D$, an additional current of the order of several amps may be supplied to the coil without it becoming normal.

Measurements of the critical currents of solenoids of niobium-zirconium and niobium tin as a function of a homogeneous background field have shown that solenoids which shown degradation in low fields can be made to approach the straight wire value of critical currents at high fields. The plot of these data is analogous to the data plotted in the figure when a degradation field, $H_d$ is substituted for the degradation temperature, $T_D$. Similar data have also been obtained from studies of flux trapping and flux shielding behavior of Type III superconducting cylinders. These studies shown that cylinders which exhibit no flux jumping at liquid helium temperature may, when operater at lower temperatures, exhibit flux jumping; i.e., shown a degradation effect. Further, it was observed that cylinders which exhibit flux jumping at low fields will enter the critical state at higher fields; i.e., when the external field reaches a sufficiently large value, a value greater than $H_d$, the degradation effect disappears.

The advantages of the present invention are readily apparent from a consideration of the data plotted in the figure which was obtained by charging a solenoid having an O.D. of 0.9 inch, an I.D. of 0.25 inch, a length of 0.6 inch, and 1460 turns of a niobium-zirconium wire—which generated a field of about 0.85K gauss per ampere—with a current varying up to the critical current at which the solenoid became resistive, and by varying the temperature of the solenoid from 4.2° K. (temperature of liquid helium at atmospheric pressure) to 10.0° K. At 4.2° K., the critical current of the solenoid was about 15 amperes. When the solenoid was brought to thermal equilibrium at a temperature of about 5.2° K. corresponding to $T_D$), charged with a current of about 43 amperes, and then cooled to 4.2° K., the solenoid carried the 43 ampere current without becoming resistive—a 180% improvement. This result demonstrates that this invention enables superconducting devices such as solenoids to carry currents greatly in excess of the normal critical current at the desired operating temperature, and that such currents can be maintained without causing the device to become resistive.

Most commercial superconducting current-carrying devices exposed to magnetic fields can be operated more efficiently at $T_D$, but there may be applications where such devices would be operated at a temperature below $T_D$. In this latter case the method of the present invention would include the step of cooling the devices to any operating temperature below $T_D$ after activation of the device is complete, i.e., after the transient state of charging has ceased.

For many such superconducting devices, $T_D$ will occur above 4.2° K. (the temperature of liquid helium). Since this temperature is easily attainable simply by providing a body of liquid helium to refrigerate the device, many practical devices will be operated at 4.2° K. By means of the present invention, the current capacity of such devices at 4.2° K. can be greatly increased or, alternately, devices of a given capacity can be constructed much smaller than heretofore possible.

In the preferred practice of this invention, a superconducting magnet will be charged at a temperature between $T_D$ and $T_c$ with a current above the degraded critical current $I_D$, the degraded critical current being the critical current of the device when charged at a temperature below $T_D$ as shown. If the superconducting solenoid which provided the data in the figure were to be charged above its degraded critical current of about 15 amps to 30 amps, for example, the device could be charged at any temperature between about 5.2° K. and about 6.8° K.

What is claimed is:

1. A method for improving the performance of a superconducting current-carrying device subject to a degradation effect formed from hard superconducting material and exposed to magnetic fields which comprises subjecting such a device to an intermediate temperature between the transition temperature of the superconducting material and its degradation temperature; and activating said device after said device has reached thermal equilibrium at said intermediate temperature.

2. A method for improving the performance of a superconducting current-carrying device subject to a degradation effect formed from hard superconducting material and exposed to magnetic fields which comprises subjecting such a device to an intermediate temperature between the transition temperature of the superconducting material and its degradation temperature; activating said device after said device has reached thermal equilibrium at said intermediate temperature; and then cooling said device to any operating temperature below said degradation temperature.

3. A method for improving the performance of a superconducting magnet subject to a degradation effect formed from hard superconducting material which comprises subjecting such magnet to an intermediate temperature between the transition temperature of the superconducting material and its degradation temperature for a sufficient time for said magnet to reach thermal equilibrium at said intermediate temperature; charging in said magnet any current up to its critical current corresponding to said intermediate temperature; and then cooling said device to any operating temperature below said degradation temperature.

4. A method according to claim 2 wherein said magnet is a cylindrical flux shield.

5. A method according to claim 2 wherein said magnet is a cylindrical flux trap.

6. A method according to claim 3 wherein said magnet is a solenoid.

References Cited

"Superconducting Magnets," International Science and Technology, May 1963, pp. 50–57 relied on, Q–1–I65, an article by Hulm et al.

BERNARD A. GILHEANY, *Primary Examiner.*

GEORGE HARRIS, Jr., *Examiner.*